STRIP DESIGN FOR A LOW COST PLASTIC TRANSISTOR

Filed Dec. 30, 1968

INVENTOR.
WILLIAM L. LEHNER
BY [signature]
[signature]
ATTORNEYS 3,564,352

STRIP DESIGN FOR A LOW COST PLASTIC TRANSISTOR

William L. Lehner, Los Altos Hills, Calif., assignor to Fairchild Camera and Instrument Corporation, Syosset, N.Y., a corporation of Delaware Filed Dec. 30, 1968, Ser. No. 787,945
Int. Cl. H01l 1/14
U.S. Cl. 317—234 6 Claims

ABSTRACT OF THE DISCLOSURE

The amount of moisture which can reach a plastic encapsulated transistor is decreased, while the heat capacity of the package is increased, by bending the lead on which the transistor die is mounted through two consecutive 90° bends thereby to double the length and mass of this lead within the package and thus to increase the distance moisture must travel along the lead to reach the transistor.

BACKGROUND OF THE INVENTION

Field of the invention

This invention relates to transistors and, in particular, to a novel lead design for plastic encapsulated transistors.

Description of the prior art

Plastic transistors, that is, transistors encapsulated in plastic packages, are well known. A typical transistor packaged in plastic consists of a selectively doped semiconductor substrate or "die" containing two PN junctions and at least two surfaces. The substrate itself comprises the collector. A base region of opposite conductivity type to the substrate is diffused into the substrate and extends to one surface of the substrate. An emitter region of the same conductivity type as the collector is diffused into the base region and likewise extends to this surface. The semiconductor substrate is bonded to one metal lead, which serves as the collector lead. Wires are then bonded from the emitter and base regions to second and third metal leads which serve as the emitter and base leads. These second and third metal leads are held, together with the first lead, in a lead frame. After wire bonding, the transistor, together with the attached leads, is encapsulated in plastic and the lead frame is removed.

The resulting plastic encapsulated transistor has several weaknesses. While the plastic itself is substantially impervious to moisture, moisture travels up the leads into the package and, in time, reacts with the bonding pads on the semiconductor substrate. As a result, the characteristics of the transistor change with time and ultimately the transistor fails. Moreover, during the operation of the transistor, heat is generated. This heat must be removed. Usually most of this heat travels along the leads and is transferred to the atmosphere. Because the heat capacity of the leads is small, operation of the transistor, even for short periods of time, result in a significant temperature rise. In addition, the portions of the leads inserted into the plastic typically are smooth. A careless tug often pulls the leads from the package, thus destroying the usefulness of the transistor.

Furthermore, the present lead design creates processing difficulties. During processing, the leads for many transistors are connected together by remnants of the metal strip from which they were originally stamped. This stamping induces or relieves various stresses within the metal with the result that the stamped strip tends to weave and bend. To overcome this so-called "camber," positive guides are required to control the movement of the strip during processing. In practice this tendency of the strip to bend, together with the fact that it is more efficient to attach semiconductor dies to the leads when the strip is horizontal rather than vertical, dictates processing the strip in the horizontal position.

This invention overcomes these above problems. In accordance with this invention, the amount of moisture which can reach the encapsulated transistor is reduced and the time necessary for this moisture to reach the transistor is increased by increasing the path-length over which the moisture must travel within the package. This is done by bending, in a selected manner, the lead to which the semiconductor die containing the transistor is bonded, thereby increasing the total length of this lead contained within the transistor package. To make it almost impossible to pull the other two leads from the package, the cross-sectional area of these two leads within the package is suddenly and abruptly increased. The resulting "barb" on each lead locks that lead in the package. Because the lead to which the transistor die is bonded is selectively bent through two 90° turns, this lead is likewise locked in the package. The increased lead mass resulting from both the larger cross-sectional area leads and the bent lead within the package serves as an additional heat sink with the result that the temperature of the transistor rises to its steady state operating temperature more slowly than in the packages of the prior art. Consequently, transient operation of the transistor occurs at a lower average temperature than does such transistor operation with prior art leads. Finally, the processing of the strip containing the bent lead of this invention is much simpler than the processing of the prior art lead strip. The bent lead serves as a hook on which to hang the strip and thus this strip can be processed vertically. Because the weight of the strip helps to force the vertically mounted strip against a vertical jig, and because the bent leads serve as guides in orienting the strip with respect to this jig, small stress differentials within the strip resulting from the stamping process interfere less with the processing of the strip than when the strip is processed horizontally.

The strip design of this invention consists of groups of leads, each group containing at least two leads, the groups being connected together by a frame of the same material as the leads. The first lead in each group is longer than the remaining leads and goes through two consecutive 90° bends. The first bend brings the lead perpendicular to the plane of the lead strip and the second bend brings the lead parallel to the plane of the lead strip but outside this plane, with the end of this first lead opposite and substantially perpendicular to the remaining leads in the group. The semiconductor die is bonded to the portion of the first lead parallel to but not in the plane of the strip and adjacent to the remaining leads. In the case of a three lead transistor, wires are then bonded from the ends of the second and third leads to the base and emitter contact pads on the semiconductor die. The resulting bonded semiconductor die and lead combination is then encapsulated in plastic and the unwanted portions of the lead frame are removed.

DETAILED DESCRIPTION

Figures 1, 2, 3, 4, 5A, 5B, 5C:
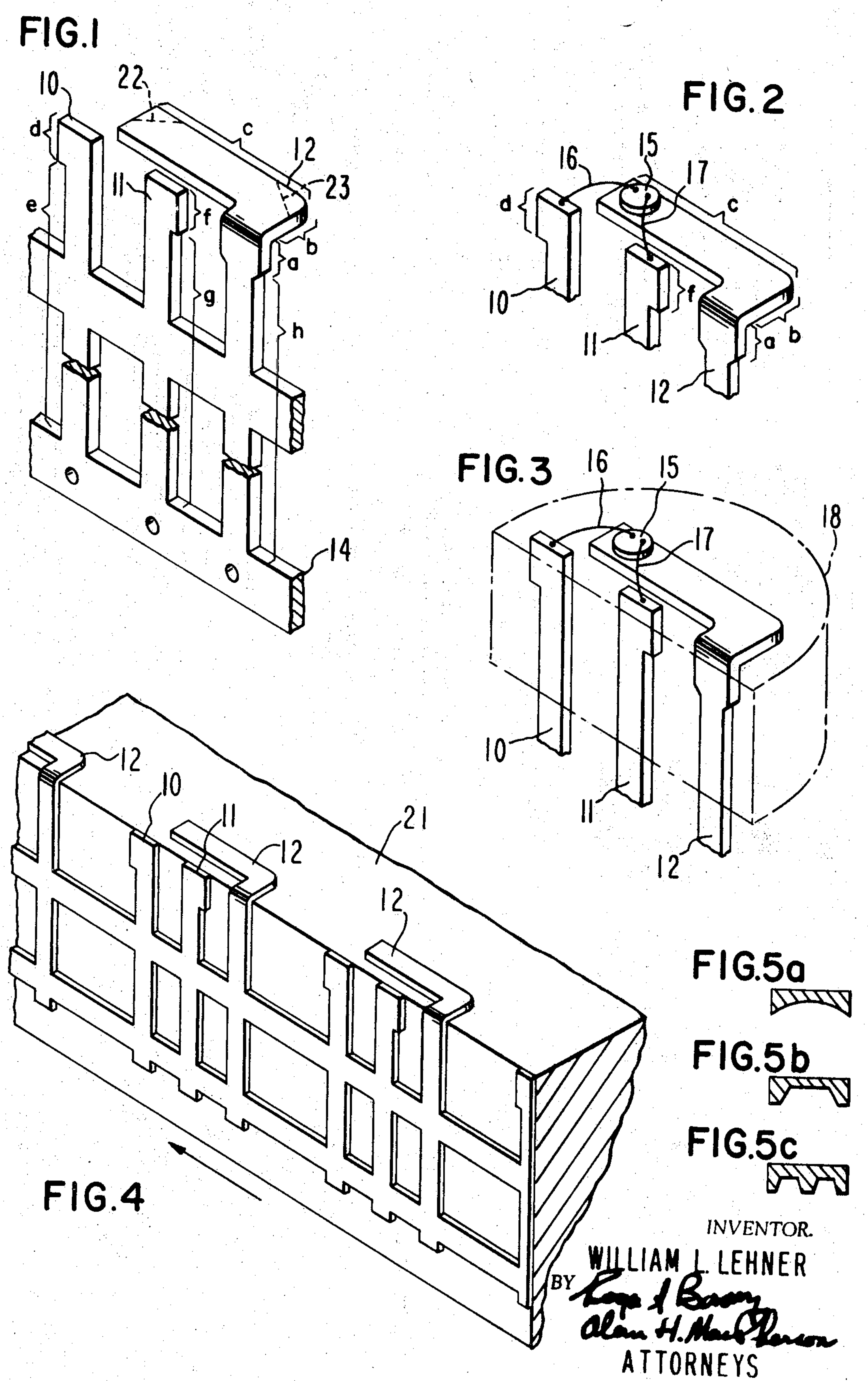
FIG. 1 shows a group of leads shaped according to this invention.
FIG. 2 shows the group of leads shown in FIG. 1 with a semiconductor die mounted thereon.
FIG. 3 shows the structure of FIG. 2 encapsulated in palstic.
FIG. 4 shows the lead strip design of this invention hanging vertically during processing.

FIG. 1 shows a group of three leads shaped according to the lead design of this invention. It should be understood that while FIG. 1 shows only one group of three leads, this invention encompasses a strip containing groups of similar leads serially connected. Such a strip is shown, for example, in FIG. 4. Moreover, while this invention will be described in terms of groups of three leads, the lead groups can contain a different number of leads, if desired.

In FIG. 1, leads 10, 11 and 12 will eventually comprise the emitter, base and collector leads to a transistor contained within a plastic package. Leads 10, 11 and 12 typically consist of a nickel-silver alloy. Actually, any conducting alloy, such as Kovar, or metal, such as copper or steel, can be used for these leads, if desired. Typically the alloy or metal used is gold plated. Because the die containing the transistor is likewise gold plated on its bottom and because gold wires are used to connect the emitter and base regions of the transistor to leads 10 and 11 respectively, the gold plate on the leads ensures good bonding between the wires and the leads and between the semiconductor die and lead 12. As shown in FIG. 1, regions *d* of lead 10 and *f* of lead 11 have an abruptly larger cross-sectional area than regions *e* and *g* of these leads. Because the plastic package, as shown in FIG. 3 extends below the ends of regions *d* and *f*, the larger cross-sectional areas of the upper portions of these leads serve to lock these leads into the package. Typical dimensions for leads 10 and 11 are a thickness of about 16 mils and in regions *e* and *g* a width of about 16 mils. In regions *d* and *f* the width, however, abruptly increases to about 25 mils. The length of regions *d* and *f* is typically 50 mils.

As shown in FIG. 1, lead 12, the collector lead, is significantly longer than leads 10 and 11. Region *a* of lead 12 extends parallel to leads 10 and 11. At a point opposite the ends of leads 10 and 11, however, lead 12 is bent at an angle of about 90° to the plane of the strip containing leads 10, 11 and 12 and continues perpendicular to this plane for the distance *b*. Then lead 12 is again bent through a 90° angle to follow a path for a distance *c* parallel to the plane of the lead strip and both opposite to the ends of leads 10 and 11 and perpendicular to these leads. Typically, distance *a* equals 50 mils, distance *b* equals 80 mils, and distance *c* equals 140 mils. As will now be shown, the two bends in lead 12 considerably simplify the attachment of a semi-conductor device to leads 10, 11 and 12.

FIG. 4 shows a lead strip containing the leads of this invention. This lead strip is moved in the direction of the arrow along a vertical jig and is suspended from the jig by the bent portons, regions *b* and *c*, of leads 12. These bent portions act as a positive stop for controlling the position of the lead strip.

As the lead strip slides across jig 21 in response to a drive (not shown) an operator places a semiconductor die 15 (FIG. 2) containing a transistor on the upturned face of lead 12. Because this face is horizontal even though the lead strip itself is vertical, the mounting of the die on the lead is carried out with the same efficiency as with the old style horizontal lead strip. But this strip, itself being vertical, is easier to handle. The die is bonded by the application of heat to the gold-plated face of lead 12, as shown in FIG. 2. Then gold wires 16 and 17 are bonded between leads 10 and 11 respectively, to the emitter and base regions of die 15. The bonding process for attaching these wires is well known and thus will not be described in detail. This bonding is usually carried out by an operator using a bonding machine.

Next, the groups of leads with the transistor dies attached and wires bonded, are encapsulated in a plastic packaging material. Typically, the plastic is either an epoxy, a phenolic or a silicone plastic. Plastic package 18, shown in FIG. 3 as a transparent plastic for illustrative purposes only, illustrates the shape and orientation of a typical package relative to the leads and semiconductor die contained within. Usually the plastic package is a dark color, opaque to light.

To aid in packaging the leads-transistor combination in a package shaped like package 18 (FIG. 3), the corners of section *c* of lead 12 (FIG. 1) can be beveled by removing the material outside dashed lines 22 and 23. Furthermore, the cross-section of lead 12 can be other than rectangular, as shown in FIGS. *5a*, *5b* and *5c*, to strengthen this lead.

The twisted lead of this invention increases by a factor of approximately two the path length which must be followed by moisture in order to reach and attack the encapsulated semiconductor die. The bend in this lead serves to lock the lead within the package. The addition of material to the ends of the emitter and base leads likewise serves to lock these leads in the semiconductor package. Advantageously, the heat storage capacity of the package is improved because the larger lead mass within the package lowers the rate at which the temperature within the package builds up to its steady state value. Thus the average transient operating temperature of the encapsulated transistor is reduced. Finally, the bent collector lead serves as a hook on which to hang the lead strip during processing. This allows the processing of the lead strip in a vertical rather than horizontal position.

What is claimed is:

1. A lead strip which comprises:

groups of leads, each group containing at least two leads, the longitudinal axes of the leads in each group, except for portions of the longitudinal axis of a first lead, being parallel to each other and being located in a plane, and the groups themselves being connected together in said plane by a frame of the same material as the leads, the first lead in each group being longer than the remaining leads and being selectively bent through two consecutive 90° angles, said first lead being first bent 90° to bring a portion of this lead perpendicular to said plane and then bent another 90° to bring a terminal portion of this lead parallel to but outside said plane with the terminal portion of this first lead being opposite and substantially perpendicular to the remaining leads in the group, said terminal portion containing a flat face on which a semiconductor die can be mounted, said flat face being perpendicular to both the plane of the lead strip and to the longitudinal axes of the remaining leads in the group.

2. Structure as in claim 1 in which each group of leads contains three leads.

3. Structure as in claim 1 in which the remaining leads in each group each comprise a straight piece of metal of a selected length, the cross-sectional area of said metal abruptly increasing a selected distance from one end of said metal.

4. Structure as in claim 1 wherein each group of leads includes a semiconductor die bonded to the terminal portion of said first lead with wires selectively bonded between selected regions on said semiconductor die and the remaining leads in the group.

5. Structure as in claim 4 wherein a plastic package encapsulates and seals each semiconductor die and a selected portion of the attached group of leads including those portions of said remaining leads where the cross-sectional area of these remaining leads changes abruptly from a small value to a larger value.

6. Structure which comprises:

a group of at least 2 leads, all except a portion of the first lead being in one plane, said first lead being longer than the other leads and said portion of said first lead going through two consecutive 90° bends, the first 90° bend bringing a part of said portion of said first lead perpendicular to said plane and said second 90° bend bringing a terminal part of said portion perpendicular to said other leads in a plane parallel to said first plane, said terminal portion containing a flat face on which a semiconductor die can be mounted, said flat face being perpendicular to both the plane of the lead strip and to the longitudinal axes of the remaining leads in the group, and at least one other lead, parallel to a portion of said first lead, which changes abruptly in cross-sectional area a selected distance from one end to thereby create a barb for locking said lead in an encapsulating material.

References Cited

UNITED STATES PATENTS

| | | | |
|---|---|---|---|
| 3,423,516 | 1/1969 | Segerson | 174—52 |
| 3,431,092 | 3/1969 | Lehner | 29—193.5 |
| 3,444,440 | 5/1969 | Bell et al. | 317—234 |
| 3,476,990 | 11/1969 | Eigeman et al. | 317—234X |

JOHN HUCKERT, Primary Examiner

R. F. POLISSACK, Assistant Examiner

U.S. Cl. X.R.

317—235; 174—52; 317—101